(12) United States Patent
Kocon

(10) Patent No.: US 6,534,828 B1
(45) Date of Patent: Mar. 18, 2003

(54) INTEGRATED CIRCUIT DEVICE INCLUDING A DEEP WELL REGION AND ASSOCIATED METHODS

(75) Inventor: Christopher Boguslaw Kocon, Plains, PA (US)

(73) Assignee: Fairchild Semiconductor Corporation, South Portland, ME (US)

(*) Notice: Subject to any disclaimer, the term of this patent is extended or adjusted under 35 U.S.C. 154(b) by 5 days.

(21) Appl. No.: 09/664,024

(22) Filed: Sep. 19, 2000

(51) Int. Cl.[7] .............................................. H01L 29/78
(52) U.S. Cl. ........................ 257/341; 257/328; 257/331
(58) Field of Search ................................ 257/327, 341, 257/328, 329–332, 334

(56) References Cited

U.S. PATENT DOCUMENTS

| | | | |
|---|---|---|---|
| 5,877,538 A | 3/1999 | Williams | 257/401 |
| 5,998,836 A | * 12/1999 | Williams | 257/341 |
| 6,084,264 A | 7/2000 | Darwish | 257/329 |
| 6,096,608 A | * 8/2000 | Williams | 438/270 |
| 6,140,678 A1 | * 10/2001 | Grabowski et al. | 257/328 |

FOREIGN PATENT DOCUMENTS

JP     07142722 A  *  6/1995

* cited by examiner

Primary Examiner—Nathan J. Flynn
Assistant Examiner—Thomas L Dickey
(74) Attorney, Agent, or Firm—Allen, Dyer, Doppelt, Milbrath & Gilchrist, P.A.

(57) ABSTRACT

An integrated circuit device includes a semiconductor layer of a first conductivity type, a plurality of spaced apart semiconductor pillars extending outwardly from said semiconductor layer and defining trenches therebetween, a respective gate structure in each trench, and at least one deep well region having the second conductivity type and being positioned to extend in the semiconductor layer between an adjacent pair of corresponding semiconductor pillars and beneath a bottom of at least one trench defining therein at least one inactive gate structure. The at least one deep well region may be positioned so that at least one trench does not include a deep well region therebeneath to define at least one active gate structure. Each semiconductor pillar may be of a second conductivity type opposite the first conductivity type.

26 Claims, 6 Drawing Sheets

INTEGRATED CIRCUIT DEVICE INCLUDING A DEEP WELL REGION AND ASSOCIATED METHODS

FIELD OF THE INVENTION

The present invention relates to the field of integrated circuits, and, more particularly, to power devices such as MOS-gated transistors.

BACKGROUND OF THE INVENTION

Semiconductor devices in the form of integrated circuits are widely used in most electronic devices. For example, computers, cellular telephones, and other similar devices typically include one or more integrated circuits (ICs). In addition, many typical types of ICs are based upon metal oxide semiconductor (MOS) technology wherein each transistor includes doped source and drain regions in a semiconductor substrate, with a well or channel region between the drain and source.

One particular configuration of MOS field effect transistor (FET) which is commonly used for high power applications is the so-called trench MOSFET. In this configuration, a semiconductor layer is formed on a substrate and doped to form a well region on a surface of the semiconductor layer opposite the substrate. Trenches are etched in the well region, usually down to the semiconductor layer, to define several body portions or pillars that extend outward from the semiconductor layer. A MOS-gated device is formed in the trenches which includes an oxide layer adjacent the trench and a corresponding portion of the semiconductor layer, and a conductive layer (e.g., polysilicon) adjacent the oxide layer. Source regions are doped on the surfaces of the pillars, and the substrate and semiconductor layer define a drain region. Channel regions will extend between the source regions and the drain region.

While the configuration of power MOSFETs makes them well suited for handling large amounts of power, a drawback of typical power MOSFET devices is that a high electric field tends to form at the trench bottoms, i.e., near the junction between the gate oxide layer and the semiconductor layer. This field may result in a failure of the oxide due to hot carrier injection, which is commonly referred to as hot carrier aging.

One prior art attempt to address this problem is found in U.S. Pat. No. 6,084,264 to Darwish et al. entitled "Trench MOSFET Having Improved Breakdown and On-Resistance Characteristics." The patent discloses a trench MOSFET including a P-type epitaxial layer overlaying an N+ substrate. An N-type drain region is implanted at the bottom of the trench into the epitaxial layer and is diffused to extend from the bottom of the trench to the substrate. As such, a junction is created between the drain region and the epitaxial layer that extends from the trench to the substrate. Yet, this structure may be disadvantageous in that the dopant used to form the drain regions must extend well beyond the trench bottoms to reach the substrate. That is, it may be difficult to provide the implantation energies and dosages required to form such drain regions due to the carrier scattering inherent in the implantation process. The carrier scattering may result in the trench sidewalls being implanted with a dopant of the wrong polarity, which in turn may nonuniformly lower device threshold and cause short channel effects.

SUMMARY OF THE INVENTION

In view of the foregoing background, it is therefore an object of the invention to provide an integrated circuit device that is less susceptible to hot carrier aging.

This and other objects, features, and advantages in accordance with the present invention are provided by an integrated circuit device including a semiconductor layer of a first conductivity type, a plurality of spaced apart semiconductor pillars extending outwardly from said semiconductor layer and defining trenches therebetween, a respective gate structure in each trench, and at least one deep well region having the second conductivity type and being positioned to extend in semiconductor layer between an adjacent pair of corresponding semiconductor pillars and beneath a bottom of at least one trench defining therein at least one inactive gate structure. Each semiconductor pillar may be of a second conductivity type opposite the first conductivity type. The at least one deep well region may be positioned so that at least one trench does not include a deep well region therebeneath to define at least one active gate structure. The at least one deep well region significantly reduces the occurrence of a high electric field at the bottoms of the active gate structures and thereby reduces hot carrier injection into the gate oxide layers.

The device may include a plurality of deep well regions arranged to define alternating active and inactive gate structures. Each semiconductor pillar comprises an upper portion having the first conductivity type, and at least one inactive gate structure may be connected to the upper portion of each semiconductor pillar. At least one inactive gate structure and the at least one active gate structure may be connected together.

Each gate structure may include a gate oxide layer adjacent the trench and a conducting layer, such as a polysilicon layer, adjacent the oxide layer. Furthermore, a semiconductor substrate may be included adjacent the semiconductor layer on a side thereof opposite the semiconductor pillars. The semiconductor substrate may include silicon and may also be more heavily doped than the semiconductor layer. The semiconductor substrate may be of the first conductivity type to thereby define a metal oxide semiconductor field effect transistor or of a second conductivity type to thereby define an insulated gate bipolar transistor, for example. The first conductivity type may be N-type and the second conductivity type may be P-type, for example.

A method for making an integrated circuit device according to the present invention includes forming a plurality of spaced apart semiconductor pillars adjacent a semiconductor layer of a first conductivity type to extend outwardly from the semiconductor layer and define trenches therebetween, forming a respective gate structure in each trench, and forming at least one deep well region having the second conductivity type to extend in the semiconductor layer between an adjacent pair of corresponding semiconductor pillars and beneath a bottom of at least one trench defining therein at least one inactive gate structure. The at least one deep well region may be positioned so that at least one trench does not include a deep well region therebeneath to define at least one active gate structure. Also, each semiconductor pillar may be of a second conductivity type opposite the first conductivity type.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar elements in alternative embodiments. The dimensions of layers and regions may be exaggerated in the figures for greater clarity.

Figure 1:
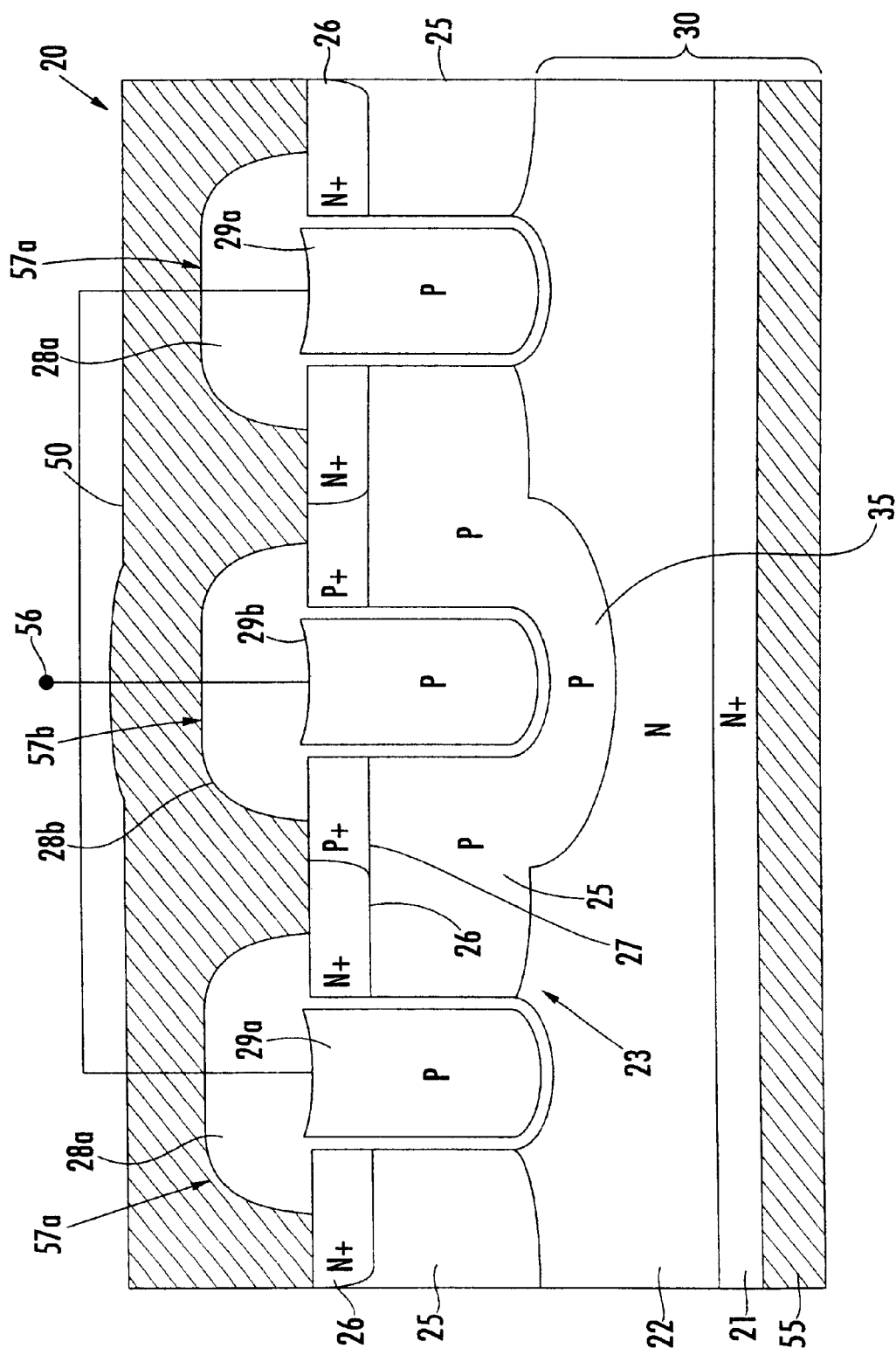
FIG. 1 is a cross-sectional view of a MOSFET device according to the present invention including a deep well region.

Referring now to the schematic block diagram of FIG. 1, a MOSFET device 20 according to one aspect of the invention is first described. The device 20 is an N-channel device that includes an N-type semiconductor substrate 21, an N-type semiconductor layer 22, and spaced apart semiconductor pillars 23 extending outwardly from the semiconductor layer and defining trenches 24 therebetween. The trenches 24 may be seen in FIGS. 5–7. The semiconductor substrate 21 is adjacent a drain metal layer 55, and the semiconductor layer 22, semiconductor substrate 21, and the drain metal layer 55 form a drain region 30. The semiconductor substrate 21 is preferably more heavily doped than the semiconductor layer 22. For example, the semiconductor substrate 21 may have a dopant concentration of about $5 \times 10^{18}$ to about $4 \times 10^{19}$ cm$^{-3}$ and a resistivity of about 0.002–0.01 Ω·cm and, the semiconductor layer 22 may have a dopant concentration of about $5 \times 10^{14}$ to about $8 \times 10^{16}$ cm$^{-3}$ and a resistivity of about 0.1–10 Ω·cm. Both the semiconductor substrate 21 and the semiconductor layer 22 may be silicon, for example, and the semiconductor layer may be epitaxially grown.

Each semiconductor pillar 23 includes a body portion 25 (which is P-type for an N-channel device) doped in the semiconductor layer 22, as described further below, and an upper portion including a source region 26 and a body contact portion 27. The body portions 25 may have a dopant concentration of about $1 \times 10^{16}$ to about $1 \times 10^{18}$ cm$^{-3}$, for example. The source region 26 will be N-type for an N-channel device and is preferably more heavily doped than the semiconductor layer 22. For example, the source region may have a dopant concentration of about $1 \times 10^{18}$ to about $1 \times 10^{20}$ cm$^{-3}$. The body contact portion 27 will be P-type for an N-channel device and is preferably more heavily doped than the body portion 25, i.e., with a dopant concentration of about $1 \times 10^{18}$ to about $1 \times 10^{20}$ cm$^{-3}$, for example.

A respective MOS gate structure 57 is formed in each trench 24 and includes a gate oxide layer 28 adjacent the trench and a conducting layer 29 adjacent the gate oxide layer. The conducting layer 29 may be polysilicon, for example, which will be N-type for the N-channel device 20, and may have a dopant concentration of about $1 \times 10^{18}$ to about $1 \times 10^{20}$ cm$^{-3}$, for example. A source metal layer 50 may be formed over the gate structures, source regions 26, and body contact portions 27.

The device 20 also includes deep well regions 35, which will be P-type for an N-channel device. Each deep well region 35 is positioned to extend in the semiconductor layer 22 between an adjacent pair of semiconductor pillars 23 and beneath a bottom of a corresponding trench 24 defining therein an inactive gate structure 57b. The deep well regions 35 are also spaced so that at least one trench does not include a deep well region therebeneath to define at least one active gate structure 57a. The deep well region 35 preferably has a dopant concentration comparable to that of the body portion 25 noted above (i.e., about $1 \times 10^{16}$ to about $1 \times 10^{18}$ cm$^{-3}$). Furthermore, the body contact portions 27 are adjacent the inactive gate structures 57b, and the source regions 26 are adjacent the active gate structures 57a.

Figure 8:
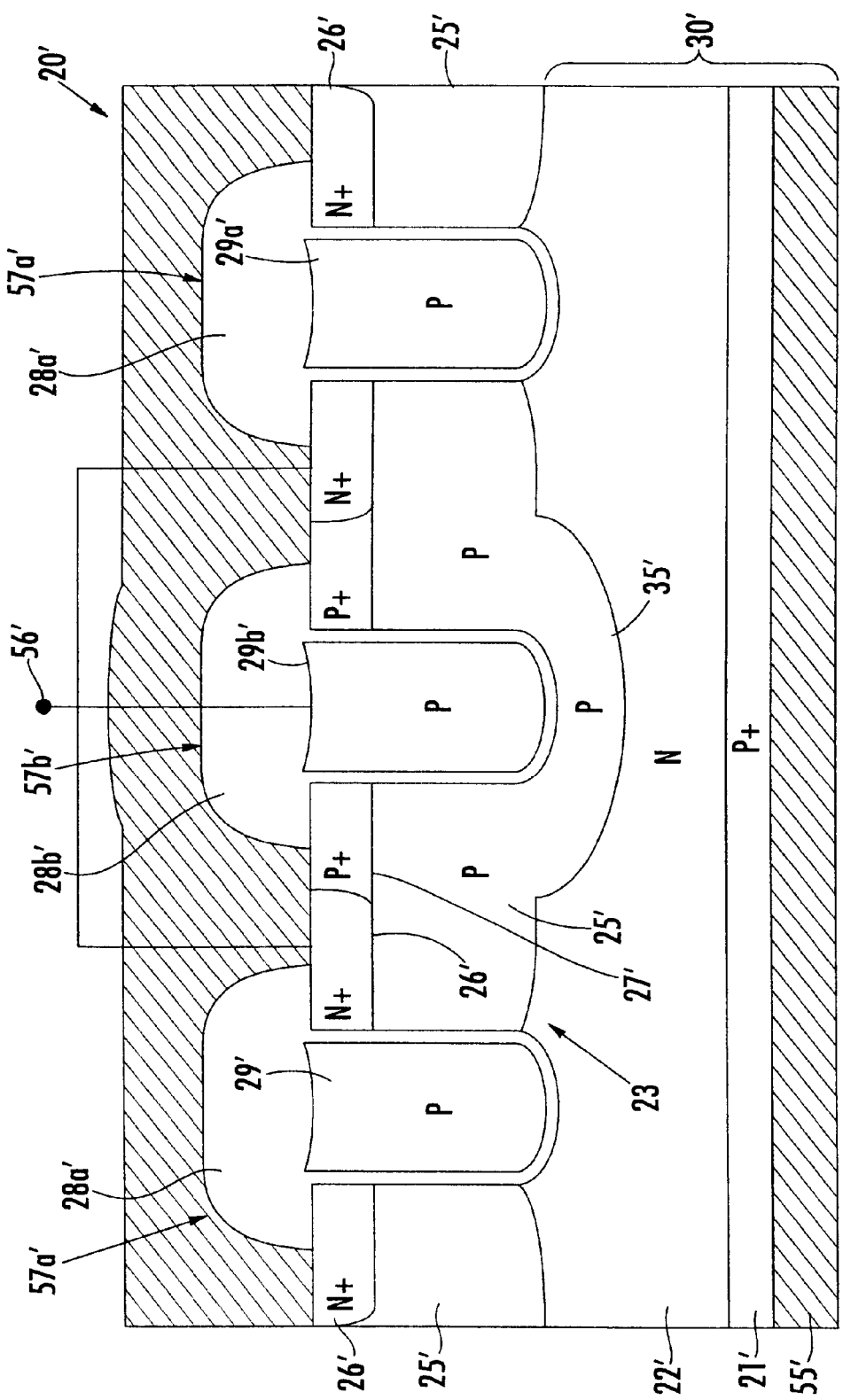
FIG. 8 is a cross-sectional view of an IGBT device according to an alternative embodiment of the present invention.

The inactive gate structures 57b may be either connected to the active gate structure 57a by a connector 56, as illustratively shown in FIG. 1, or connected together with the source regions 26' by a connector 56', as illustratively shown in the alternative embodiment of FIG. 8. In either case, the improved breakdown characteristics realized by the device 20 according to the present invention (which are discussed below) are not lost since during a blocking stage the conductive layers 29a will be at the same potential as the source regions 26. Even so, in some applications it may be desirable to connect the inactive gate structures 57b to the source region 26, as substantially no increase in an input or gate-well capacitance of the device will occur, as will be appreciated by those of skill in the art.

Figure 2:
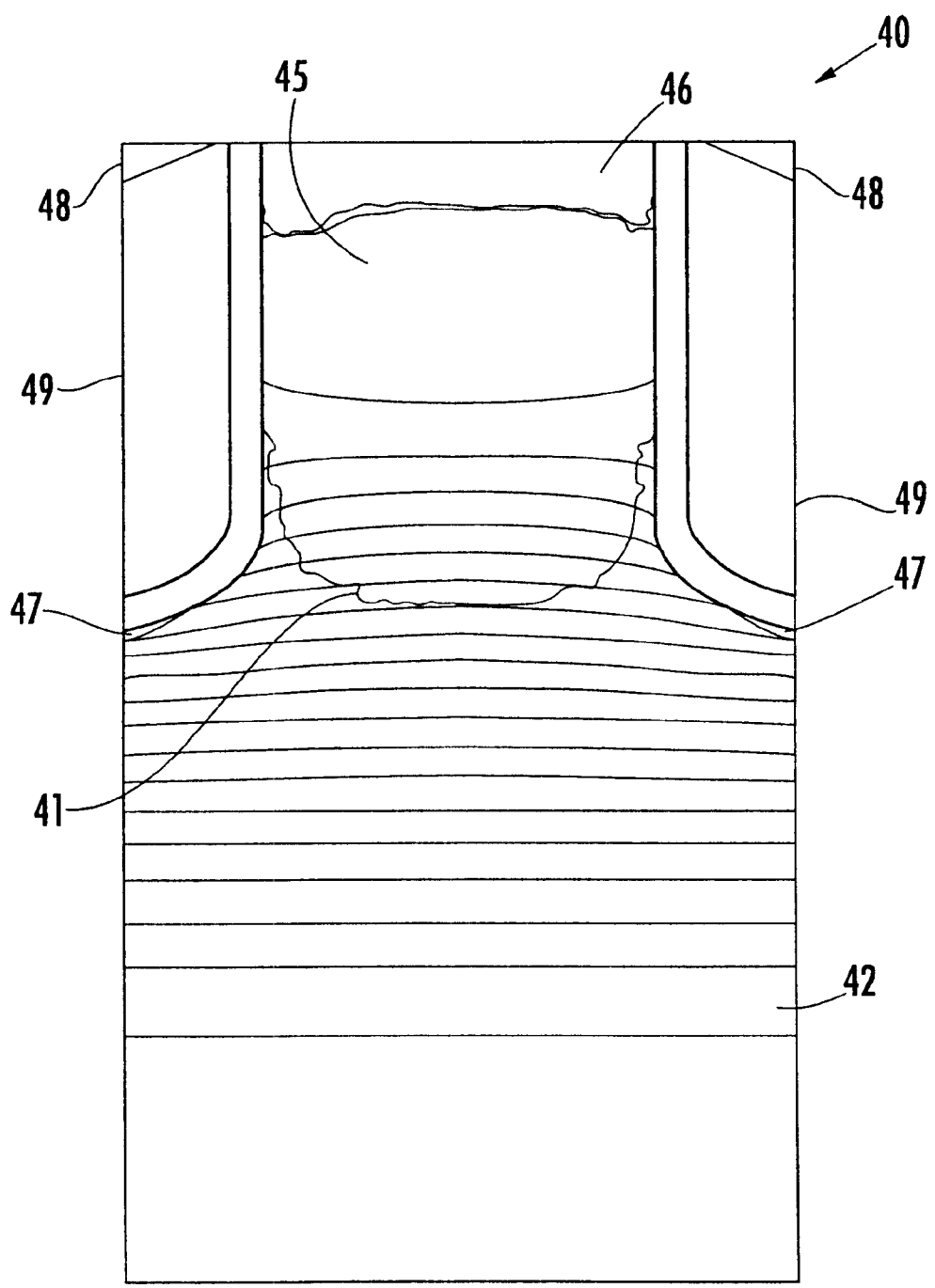
FIG. 2 is a cross-sectional view of a simulated prior art MOS-gated device showing the formation of a high electric field at a trench bottom.
Figure 3:
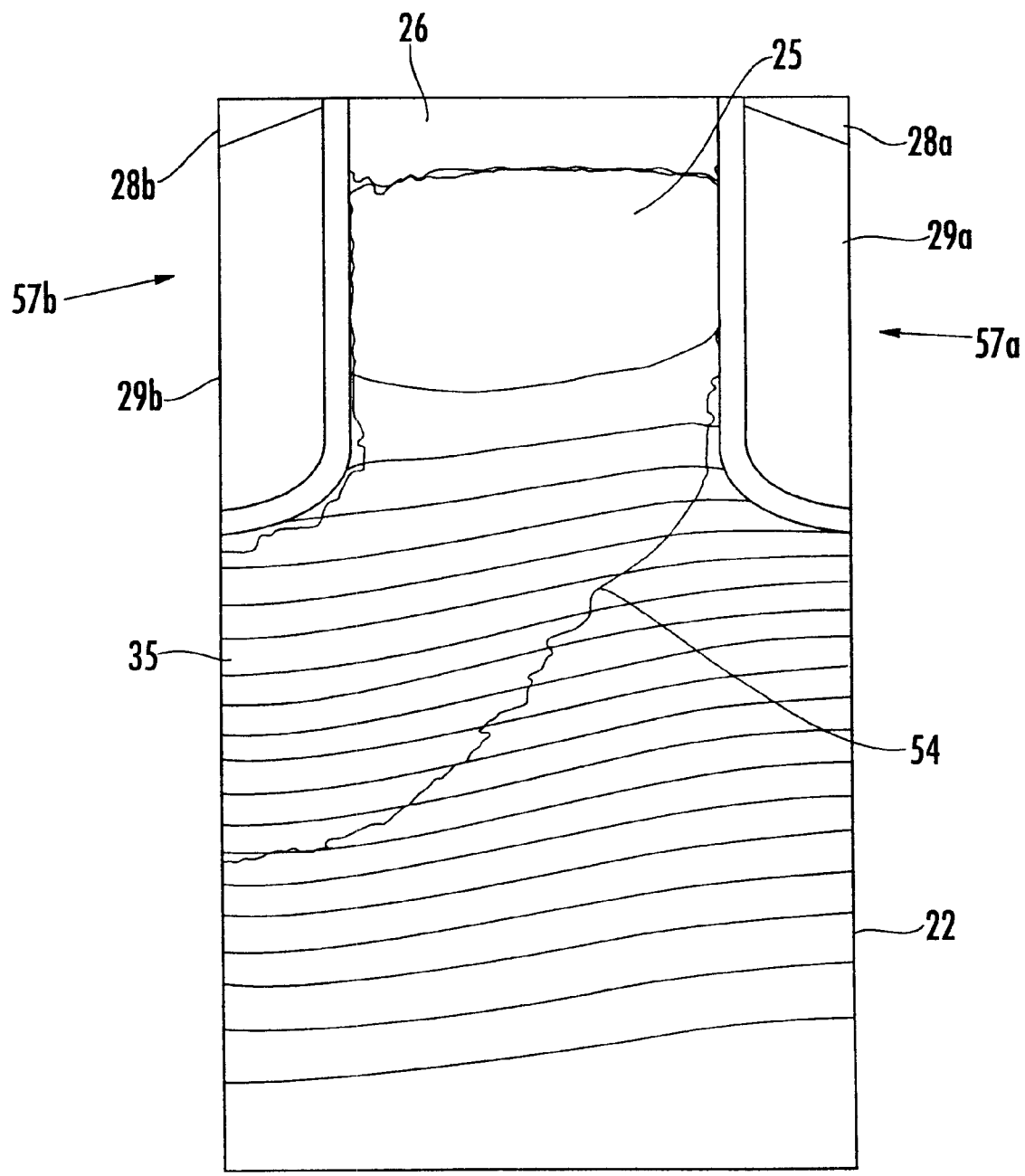
FIG. 3 is a cross-sectional view of a simulated MOS-gated device according to the present invention including an extended deep well region.

The advantages of the present invention will be more fully understood upon comparison of the simulated prior art MOS-gated trench device 40 shown in FIG. 2 with the simulated MOS-gated device 20 of the present invention shown in FIG. 3. The prior art device 40 includes gate structures including an oxide layer 48 and a conducting layer 49 formed within respective trenches in the semiconductor layer 42 and adjacent a body portion 45. The body portion 45 has a source region 46 formed in an upper portion thereof. It can be seen that a junction 41 between the body portion 45 and the semiconductor layer 42 does not extend below the trenches.

As will be appreciated by those of skill in the art, a high electric field 47 may form at the bottoms of the trenches where the gate oxide layers 48 interface with the semiconductor layer 42 when a blocking voltage is applied to the device 40. The electric field 47 results in hot carrier injection that may break down the oxide layer 48, which in turn decreases performance and may ultimately result in catastrophic failure of the oxide layer.

In accordance with the present invention, the deep well region 35 shown in FIG. 3 reduces the occurrence of a high electric field at the bottom of the trenches having the active gate structures 57a. That is, the deep well region 35 forms a junction 54 between the deep well region and the semiconductor layer 22. The deep well region 35 shields the bottoms of the gate oxide layer 28a and cause a layer potential to be dropped on both sides of the junction 54. The reduction of the electric field correspondingly reduces hot carrier injection at the gate oxide layers 28a and therefore alleviates breakdown due to hot carrier aging. Furthermore, improved breakdown voltage characteristics are also realized. As a result, the semiconductor layer 22 may be more heavily doped than in prior art devices. This provides a significantly lower resistance to current flowing through the drain region 30, which in turn reduces device "on" resistance and improves device efficiency, as will be appreciated by those of skill in the art.

The deep well regions 35 may be spaced apart to define alternating active and inactive gate structures, as shown in FIG. 1. Of course, the deep well regions 35 may also be spaced apart to define every third, fourth, etc., gate structure (or even intermittent gate structures) as an inactive gate structure, as will be appreciated by those of skill in the art.

Figure 4:
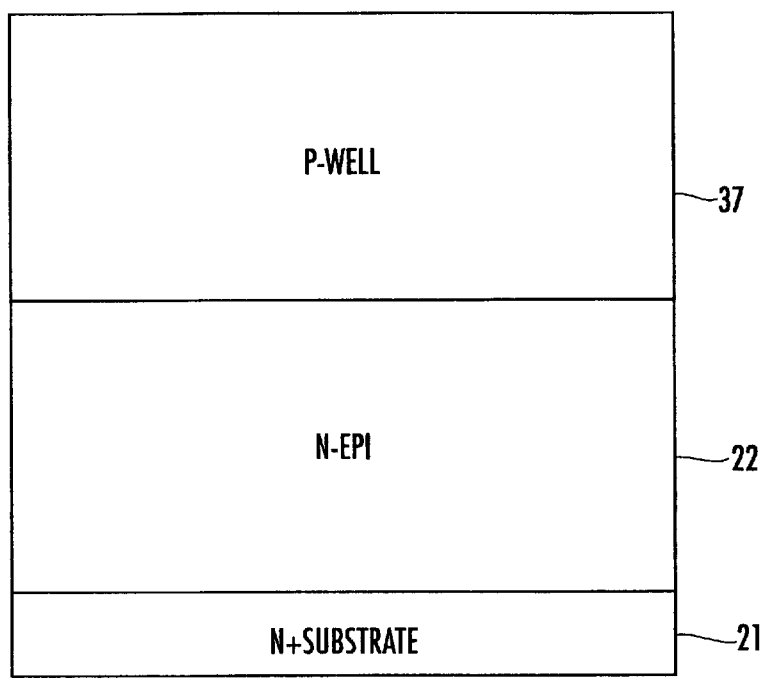
FIGS. 4–7 are schematic cross-sectional views illustrating making of the deep well region in accordance with the present invention.
Figure 5:
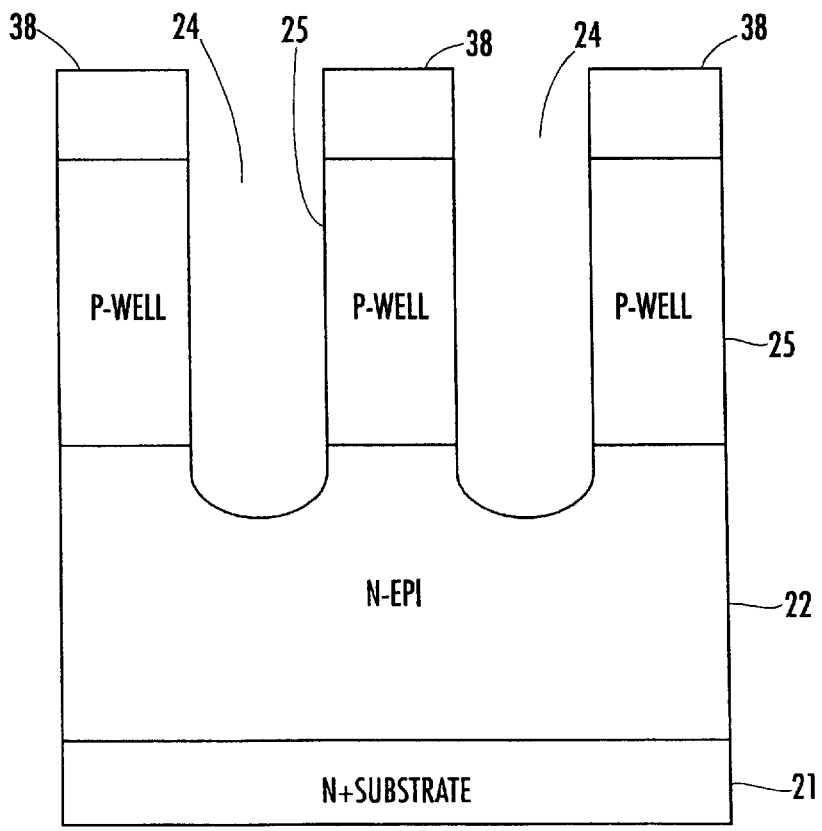

Turning now additionally to FIGS. 4–7, a method for making an integrated circuit device including deep well regions 35 according to the present invention is now described. The semiconductor layer 22 is epitaxially grown, for example, adjacent the semiconductor substrate 21, as shown in FIG. 4. An upper portion of the semiconductor layer 22 is then doped with a P-type dopant (e.g., by implantation) such as Boron, for example, to form a P-well region 37 therein. The P-type dopant implant may be in a range of about $1\times10^{12}$ to about $5\times10^{14}$ cm$^{-2}$, for example. A mask 38 may then be deposited on an upper surface of the P-well region 37, as shown in FIG. 5, so that the trenches 24 may be etched. The trenches 24 define the body portions 25 in the P-well region 37 which extend outwardly from the semiconductor layer 22. A sacrificial oxide layer (not shown) may then optionally be formed in the trenches 24.

Figure 6:
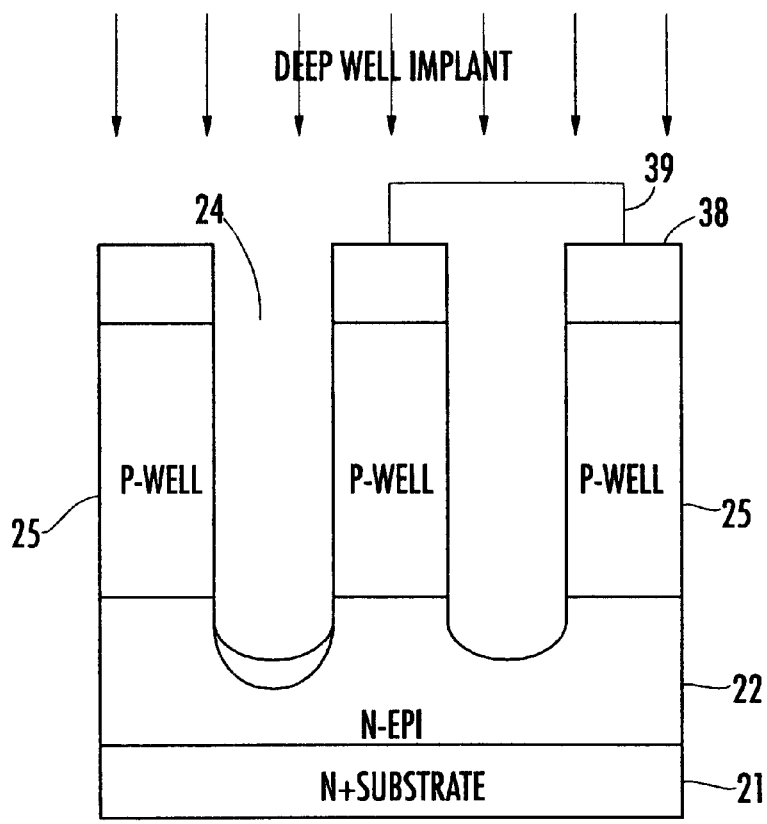
Figure 7:
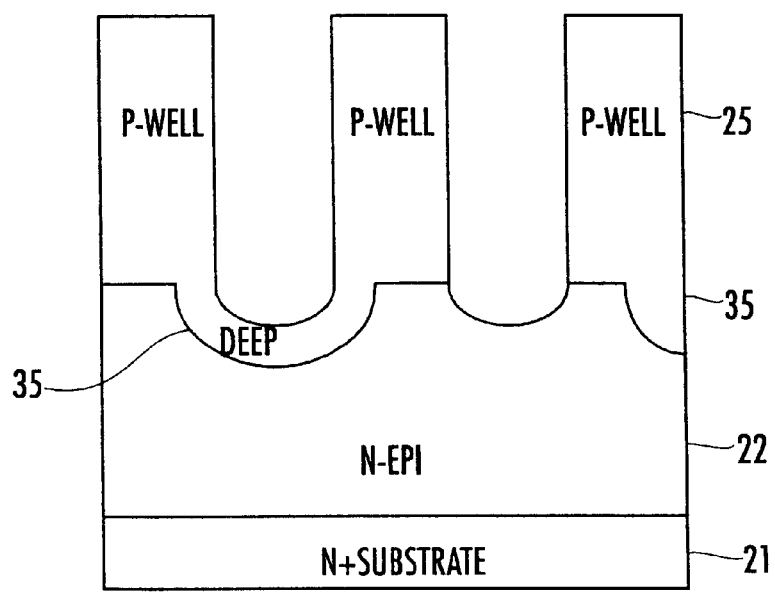

A deep well mask 39 may then be deposited over the trenches 24 in which the active gate structures will be formed so that a deep well implant may be performed in the remaining trenches, as shown in FIG. 6. The deep well implant may be the same implant used to form the P-well region 37, for example. The masks 38, 39 and the sacrificial oxide layer (if present) may then be removed, as shown in FIG. 7. When heat is applied during formation of the gate oxide layers 28, the deep well implants in the bottoms of the trenches 24 diffuse into the semiconductor layer 22 to extend between adjacent pairs of corresponding body portions 25 to form the deep well regions 35.

It will be appreciated that the above described steps may be completed using conventional methods known to those of skill in the art, which require no further discussion herein. Furthermore, the active and inactive MOS gate structures, source regions 26, body contact portions 27, and metal layers 50, 55 may also be formed using conventional techniques known to those of skill in the art. As noted above, the inactive gate structures 57b may be either connected to the source regions 26 or connected together with the active gate structures 57a during formation thereof.

While the above embodiment has been illustratively shown as an N-channel device, those of skill in the art will appreciate that other configurations, such as P-channel devices, may also be realized according to the present invention. Furthermore, the invention may be used with devices other than the embodiment described above, such as in insulated gate bipolar transistors (IGBTs) or MOS-controlled thyristors (MCTs), for example. An IGBT device 20' having a P+ substrate 21' is illustratively shown in FIG. 8. The remaining elements shown in FIG. 8 are similar to those discussed above with reference to FIG. 1 and require no further discussion herein. Additionally, the dopant concentrations given above for the various layers and regions according to the present invention are exemplary, and those of skill in the art will understand that other dopant concentrations may be used without departing from the scope of the invention.

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that other modifications and embodiments are intended to be included within the scope of the appended claims.

That which is claimed is:

1. An integrated circuit device comprising:
   a semiconductor layer of a first conductivity type;
   a plurality of spaced apart semiconductor pillars extending outwardly from said semiconductor layer and defining trenches therebetween, each semiconductor pillar being of a second conductivity type opposite the first conductivity type;
   a respective gate structure in each trench; and
   at least one deep well region having the second conductivity type and being positioned to extend in said semiconductor layer between an adjacent pair of corresponding semiconductor pillars and beneath a bottom of at least one trench defining therein at least one inactive gate structure, said at least one deep well region being positioned so that at least one trench does not include a deep well region therebeneath to define at least one active gate structure.

2. The device of claim 1 wherein said at least deep well region comprises a plurality of deep well regions arranged to define alternating active and inactive gate structures.

3. The device of claim 1 wherein said at least one deep well region has a dopant concentration in a range of about $1\times10^{16}$ to $1\times10^{18}$ cm$^{-3}$.

4. The device of claim 1 wherein each semiconductor pillar comprises an upper portion having the first conductivity type.

5. The device of claim 4 wherein said at least one inactive gate structure is connected to the upper portion of each semiconductor pillar.

6. The device of claim 1 wherein said at least one inactive gate structure and said at least one active gate structure are connected together.

7. The device of claim 1 wherein each gate structure comprises a gate oxide layer adjacent said trench and a conducting layer adjacent said gate oxide layer.

8. The device of claim 7 wherein said conducting layer comprises polysilicon.

9. The device of claim 1 further comprising a semiconductor substrate adjacent said semiconductor layer on a side thereof opposite said semiconductor pillars.

10. The device of claim 9 wherein said semiconductor substrate comprises silicon.

11. The device of claim 9 wherein said semiconductor substrate is more heavily doped than said semiconductor layer.

12. The device of claim 9 wherein said semiconductor substrate is of the first conductivity type thereby defining a metal oxide semiconductor field effect transistor.

13. The device of claim 9 wherein said semiconductor substrate is of the second conductivity type thereby defining a insulated gate bipolar transistor.

14. The device of claim 1 wherein the first conductivity type is N-type and the second conductivity type is P-type.

15. A MOS-gated integrated circuit device comprising:
   a semiconductor substrate;
   a semiconductor layer of a first conductivity type on said semiconductor substrate;
   a plurality of spaced apart semiconductor pillars extending outwardly from said semiconductor layer and defining trenches therebetween, each semiconductor pillar being of a second conductivity type opposite the first conductivity type;
   a respective MOS gate structure in each trench comprising a gate oxide layer adjacent said trench and a conducting layer adjacent said gate oxide layer;

a plurality of deep well regions having the second conductivity type, each deep well region being positioned to extend in said semiconductor layer between an adjacent pair of semiconductor pillars and beneath a bottom of a corresponding trench defining therein an inactive gate structure, said deep well regions being spaced apart to define active gate structures therebetween.

16. The device of claim 15 wherein each deep well region has a dopant concentration of about $1 \times 10^{16}$ to $1 \times 10^{18}$ cm$^{-3}$.

17. The device of claim 15 wherein said plurality of deep well regions are spaced apart to define alternating active and inactive gate structures.

18. The device of claim 15 wherein each semiconductor pillar comprises an upper portion having the first conductivity type.

19. The device of claim 18 wherein said at least one inactive gate structure is connected to the upper portion of each semiconductor pillar.

20. The device of claim 15 wherein said inactive gate structure and said active gate structure are connected together.

21. The device of claim 15 wherein said conducting layer comprises polysilicon.

22. The device of claim 15 wherein said semiconductor substrate comprises silicon.

23. The device of claim 15 wherein said semiconductor substrate is of the first conductivity type thereby defining a metal oxide semiconductor field effect transistor.

24. The device of claim 15 wherein said semiconductor substrate is of the second conductivity type thereby defining an insulated gate bipolar transistor.

25. The device of claim 15 wherein said semiconductor substrate is more heavily doped than said semiconductor layer.

26. The device of claim 15 wherein the first conductivity type is N-type and the second conductivity type is P-type.

* * * * *